United States Patent [19]

Bradford et al.

[11] Patent Number: 4,713,821

[45] Date of Patent: Dec. 15, 1987

[54] SEMICONDUCTOR LASER AND OPTICAL AMPLIFIER

[75] Inventors: James N. Bradford, Arlington; Jimmy R. Ames, Middleburg; Andrew H. Montroll, Reston, all of Va.

[73] Assignee: The Perkin-Elmer Corporation, Norwalk, Conn.

[21] Appl. No.: 780,879

[22] Filed: Sep. 27, 1985

[51] Int. Cl.$^4$ ............................................. H01S 3/19
[52] U.S. Cl. ................................................... 372/44
[58] Field of Search ............................. 372/43, 44, 6

[56] References Cited

U.S. PATENT DOCUMENTS 3,808,549  4/1974  Maurer ................................. 372/6
4,553,238  11/1985  Shaw et al. .......................... 372/6

Primary Examiner—Gene Wan
Attorney, Agent, or Firm—Thomas P. Murphy; Edwin T. Grimes; Francis L. Masselle

[57] ABSTRACT

A semiconductor source of high power, spatially and temporally coherent light including means to prevent damage to the output face. A laser diode is disposed in optical contact with a power amplifier having a diverging active area which causes emitted light to be distributed over a large facet area.

16 Claims, 3 Drawing Figures

SEMICONDUCTOR LASER AND OPTICAL AMPLIFIER

BACKGROUND OF THE INVENTION

Semiconductor light amplification devices are well known. Such a device is described in an article entitled "Coherent Light Emission from p-n Junctions" published in Solid state Electronics, vol. 6, page 405, 1963. This article describes a laser diode comprising a single semiconductor crystal having a p-doped region and an n-doped region about whose plane boundary, or junction, the population of p and n carriers, i.e., holes and electrons, has been depleted by recombination. That depletion region is also known as the active region. Injection of current into the crystal in a direction transverse to the junction provides additional p and n carriers, which recombine within the active region, emitting one quantum of light energy, or photon, at each such recombination. As a rule, all the emitted photons will have nearly, but not exactly, the same wavelength within a small range characteristic of the semiconductor. By virtue of the crystal's large index of refraction, the cleaved ends, or facets, of the crystal perpendicular to the active region reflect a substantial part of the emitted light, typically thirty percent, back into the active area. As the current injected into the diode is increased, accompanied by a higher rate of photon emission, photons in the active region begin to stimulate carrier recombinations whose consequent emitted photons have the same wavelength and phase as the stimulating photons. The photons fed back to the active region by reflection enhance that process and, at the same time, the resonances of the cavity formed by the opposed reflecting facets promote the selection of discrete wavelengths. Increasing current soon crosses a threshold beyond which coherent emitted light at one or a few such wavelengths increases rapidly. Such coherent light is a laser beam. As is well known, laser beams have found utility in a wide variety of areas, e.g., in the medical and communications fields.

It has been characteristic of laser diodes that the power or intensity they generate is low. To mitigate this limitation, it is well known to optically couple an optical amplifier with the laser diode. Such an optical amplifier is very similar to a laser diode with the exception that the facets of the active region are not reflecting. By means of stimulated photon emission, the optical amplifier raises the power or intensity of the laser light emitted through its output facet without interfering with the coherence properties of the light.

Two serious problems associated with semiconductor diode optical amplifiers severely limit the amplification and the power they can achieve. The first is gain saturation resulting from the interdependence of power density, within the laser beam traversing the optical amplifier, and the electrical power, represented by the injected carriers. At a given electrical pump rate, there is, in the absence of a laser beam, a fixed carrier density in the active region. As the power density of a laser beam traversing the amplifier increases, it reduces the carrier density and, therefore, limits or saturates the gain. To avoid gain saturation, the carrier density must be held constant. The second problem is degradation and catastropic damage of a facet that occurs when the internal power density incident on the facet exceeds certain limits. The present invention overcomes both of these problems.

BRIEF SUMMARY OF THE INVENTION

The present invention relates to a semiconductor light generating device which comprises a semiconductor laser diode (LD) having an output facet optically coupled to an optical power amplifier (OA), e.g., the LD and OA may be disposed in contact with each other. The OA is formed so that its active region diverges in the forward direction. The laser beam diverges by diffraction as it leaves the LD and expands within the medium of the diverging active region of the OA so that the output laser beam is distributed over a wider area of the output facet of the OA than would be the case without the divergence. Exciting, or pump, current injected into the OA establishes the gain, or amplification, required to maintain constant optical power density within the amplifier active region from the entrance facet to the exit facet, eliminating both gain saturation and facet damage.

It is a principal object of the present invention to provide a semiconductor source of high-power coherent light.

Another object of the invention is to provide a semiconductor source of coherent light that is scalable to arbitrarily high power.

Yet another object of the invention is to provide a semiconductor source of high-power coherent light that is protected from optical degradation and damage of facets.

A still further object of the invention is to provide a means of avoiding gain saturation in an optical amplifier of arbitrary desired gain.

Another object of the invention is to provide a semiconductor source of high-power coherent light in a single spatial and temporal mode.

Yet another object of the invention is to provide a semiconductor source of high-power coherent light that can be directly modulated at digital rates as high as any achievable directly in low-power laser diodes.

A still further object of the invention is to provide a semiconductor source of high-power coherent light in a single spatial and temporal mode that can be directly modulated at digital rates as high as any achievable directly in low-power laser diodes.

Other objects and advantages of the present invention will be apparent from the following description when taken with the drawings.

DETAILED DESCRIPTION OF A PREFERRED EMBODIMENT

Figure 1:
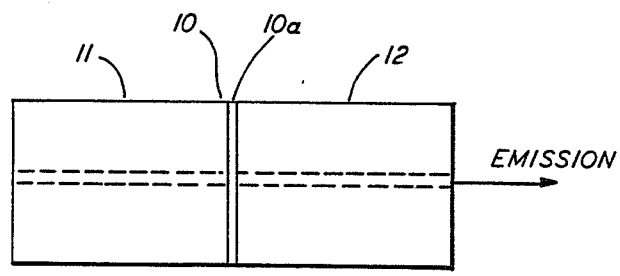
FIG. 1 is an elevational view of one embodiment of the semiconductor laser diode and optical amplifier (LDOA) of the present invention.

The advantages and improvements of the present invention over the prior art can best be understood after consideration of the Figures. In FIG. 1 is depicted an elevational view of the preferred embodiment of LDOA 10 demarking semiconductor laser diode (LD) 11 and optical power amplifier (OA) 12. The completed LDOA 10 is shown in detail in FIG. 2. As grown, LDOA 10 is a single crystal integral with many others on a single substrate. After crystal growth, doping, and electrical contact metallization are completed, the resultant semiconductor wafer is cleaved along prescribed crystal planes and at specified spatial dimensions to provide a multiplicity of LDOA's, any one of which may be selected for LDOA 10 presently under consideration. At an intermediate stage in wafer cleaving, all OA exit facets receive an antireflection (AR) coating. All of these aforementioned procedures and processes are well known in the art. The selected unit, attached to a highly precise reference surface, is cleaved to form a crack or division 10a along a crystal plane and at the predetermined dividing line between LD 11 and OA 12, said division 10a creating a facet 11d that, taken with facet 11c, establishes the required resonant cavity for LD 11. Division 10a also includes facet 12c, which is the optical entrance to OA 12. LDOA 10 remains essentially a single unit, with only a slight longitudinal shift on the order of a wavelength of light resulting from the cleave, and LD 11 and OA 12 remain in essentially perfect optical alignment.

Facet 11c may receive coatings or other treatment to adjust the amount of optical feedback in LD 11.

Figure 2:
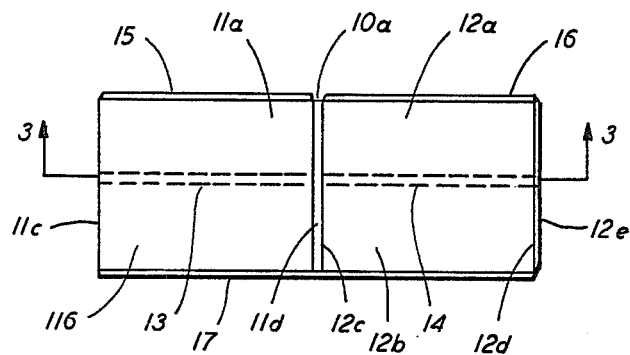
FIG. 2 is an elevational view of the detailed structure of the LDOA of FIG. 1.
Figure 3:
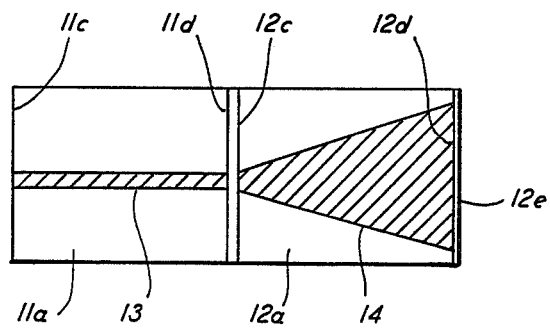
FIG. 3 is a sectional view of the LDOA of FIG. 2 taken through the line 3—3.

As revealed in FIG. 2, LD 11 comprises an active region 13 disposed between a p layer 11a and an n layer 11b of semiconductor material. Typically active region 13 is a small-bandgap aluminum gallium arsenide ($Al_{0.03}Ga_{0.97}As$), and layers 11a, 11b are larger-bandgap aluminum gallium arsenide ($Al_{0.3}Ga_{0.7}As$), creating an optical waveguide in a plane perpendicular to the junction. A typical p dopant is zinc (Zn) and a typical n dopant is tellurium (Te). For these materials the natural facet reflectivity is about 0.3. As will be clear to one with ordinary skill in the art, any laser diode structure, designed to convey any desired property such as rapid switchability or control of transverse and lateral modes, may be applied to LD 11. Current is injected into LD 11 through positive electrical contact 15 and negative electrical contact 17. Viewed in elevation, with active region 14 disposed between p layer 12a and n layer 12b of semiconductor material, OA 12 may show a structure entirely similar to that of LD 11, differing only in AR coating 12e in contact with facet 12d. FIG. 3, on the other hand, clearly differentiates the rectangular geometry of active region 13, in the 3—3 plane, the junction plane, of LDOA 10 from the trapezoidal geometry of active region 14. At the entrance facet 12c of OA 12, active region 14 has approximately the same junction-plane or lateral dimension as does active region 13, and the lateral dimension increases linearly with increasing distance in the direction of exit facet 12d. The required width or lateral dimension of active region 14 at output facet 12d is determined by:

$$W_{out} = P_{out}/P_{in} W_{in},$$

where $W_{out}$ is width at the output facet 12d, $W_{in}$ is width at the input facet 12c, $P_{out}$ is output power, and $P_{in}$ is input power. In operation, to obtain the design value of $P_{out}$, the gain coefficient, which is related to the injected current (see *Semiconductor Lasers and Heterojunction LED's* by Henry Kressel and J. K. Butler, Academic Press, 1977 and *Heterostructure Lasers* by H. C. Casey. Jr. and M. B. Panish, Academic Press, 1978), must be adjusted for the length of OA 12. That is to say, the OA 12 gain must be maintained independent of the length. The length, itself, for a desired $P_{out}$ may be determined from $W_{in}$, the vacuum wavelength, and the refractive index of the active region by means of well-known relationships of diffraction and geometry. If the gain coefficient is properly established for a particular length of OA 12, then the optical power density remains constant with longitudinal position throughout active region 14, and $P_{out}$ may be increased arbitrarily by appropriate lengthening of OA 12 with the same rate of expansion for active region 14. Since the power density is constant, so also is the injected carrier density constant throughout the active region 14, and, in consequence, the gain coefficient remains unaffected by the growth of total power from input to output of OA 12. Said more simply, the gain does not saturate, even though the length of OA 12 be increased arbitrarily. In all such cases, if the input power density is below the threshold for facet damage the output facet is similarly protected. Current is injected into OA 12 through positive electrical contact 16 and negative electrical contact 17, the latter of which is common to both OA 12 and LD 11.

In typical operation, OA 12 receives a constant direct electric current, while LD 11 receives a direct current that is switched or otherwise temporally modulated, according to the requirements of the application. Since OA 12 is not involved in the modulation process but amplifies with fidelity digital signals of appropriate input power, LD 11 may have an output of, for example, one watt modulated at a rate of a billion bits power second. With further choices of structure for LD 11, single spatial and temporal modes may be obtained, even in combination with large modulation rates.

As an example, consider an LD 11 250 micrometers in length having an active region 13 1.5 micrometers wide and 0.5 micrometers thick, for a cross-sectional area of 0.75 square micrometers. Assume a facet damage threshold of 20 milliwatts output per square micrometer, so that the output 3 power threshold for facet damage in LD 11 is $0.75 \times 20 = 15$ milliwatts. Allowing a safety factor of three, LD 11 can safely generate $P_{out}=5$ milliwatts. With a facet reflectance of 0.3, the input to OA 13 is 3.5 milliwatts. Preserving the input power density at the output and designing for $P_{out}=1$ watt (1000 milliwatts) dictates $W_{out}=1000/3.5 \times 1.5 = 429$ micrometers. Let the vacuum wavelength be 800 nanometers. The diffraction divergence of the input beam is 17.3 degrees, so that the length of OA 12 must be approximately 1.41 millimeter.

While the present invention has been shown and described with reference to a preferred embodiment thereof, it will be understood by those skilled in the art that changes in form and details may be made therein without departing from the intent and scope of the invention. Accordingly, it is understood that the invention is to be broadly construed within the spirit and scope of the claims.

What is claimed is:

1. A semiconductor light generating device comprising:
    laser diode means for generating a laser beam; and
    a multi-layered planar semiconductor optical power amplifier optically coupled to said laser diode means having a planar active region with an input and output cross sectional area perpendicular to said active region, said input area being smaller than said output area.

2. A semiconductor light generating device as in claim 1 wherein:

the power density within said active region during operation is constant.

3. A semiconductor light generating device according to claim 1 wherein:
said active region increases linearly in width in the amplifying direction from said input area to said output area.

4. A semiconductor light generating device according to claim 1 wherein:
said laser diode means and said optical power amplifier are in contact with each other.

5. A semiconductor light generating device according to claim 4 wherein:
said active region has a constant thickness.

6. A semiconductor light generating device according to claim 4 wherein:
said optical power amplifier includes layers of n and p material with said active region disposed therebetween.

7. A semiconductor light generating device according to claim 6 wherein:
said optical power amplifier includes input and output facets;
said output facet has antireflecting properties.

8. A semiconductor light generating device according to claim 1 wherein:
said laser diode means comprises an active region disposed between layers of n and p material;
said laser diode means comprises front and back facets.

9. A semiconductor light generating device according to claim 1 wherein:
said laser diode means and said optical power amplifier are in optical alignment with each other.

10. A semiconductor light generating device according to claim 1 wherein:
said laser diode means and said optical power amplifier are an integral semiconductor.

11. A semiconductor light generating device according to claim 10 wherein:
said active region has a constant thickness.

12. A semiconductor light generating device according to claim 11 wherein:
said optical power amplifier includes layers of n and p material with said active region disposed therebetween.

13. A semiconductor light generating device according to claim 12 wherein:
said optical power amplifier includes an output facet;
said output facet has antireflecting properties.

14. A semiconductor light generating device according to claim 10 wherein:
said integral semiconductor has been divided by cleaving to demark said laser diode means and said optical power amplifier;
said cleaving has preserved optical alignment;
said laser diode means and said optical power amplifier are in contact with each other.

15. A semiconductor light generating device according to claim 8 wherein:
said back facet has highly reflecting properties.

16. A semiconductor light generating device according to claim 9 wherein:
said back facet has highly reflecting properties.

* * * * *